United States Patent [19]

Hosten

[11] Patent Number: 5,772,765
[45] Date of Patent: Jun. 30, 1998

[54] DEVICE FOR PROCESSING FLAT WORKPIECES, IN PARTICULAR PRINTED CIRCUIT BOARDS

[75] Inventor: Daniel Hosten, Handzame, Belgium

[73] Assignee: Siemens S.A., Brussels, Belgium

[21] Appl. No.: 737,257

[22] PCT Filed: May 9, 1995

[86] PCT No.: PCT/EP95/01754

§ 371 Date: Nov. 12, 1996

§ 102(e) Date: Nov. 12, 1996

[87] PCT Pub. No.: WO95/31589

PCT Pub. Date: Nov. 23, 1995

[30] Foreign Application Priority Data

May 11, 1994 [DE] Germany ......................... 44 16 708.3

[51] Int. Cl.⁶ ...................................................... B05C 3/02
[52] U.S. Cl. ......................... 118/405; 118/423; 118/429; 427/96; 427/98; 427/430.1
[58] Field of Search .................................... 118/405, 423, 118/429; 427/96, 98, 430.1, 434.6

[56] References Cited

U.S. PATENT DOCUMENTS

| | | | |
|---|---|---|---|
| 312,451 | 2/1885 | Ehret | 118/429 |
| 3,120,795 | 2/1964 | Land | 118/405 |
| 4,401,522 | 8/1983 | Buschow et al. | 204/15 |
| 4,724,856 | 2/1988 | Pender | 118/405 |
| 4,812,101 | 3/1989 | George et al. | 414/220 |
| 4,862,713 | 9/1989 | Kutz et al. | 118/429 |
| 5,186,279 | 2/1993 | Chasteen et al. | 118/405 |
| 5,592,958 | 1/1997 | Gardner | 118/405 |

FOREIGN PATENT DOCUMENTS 0 421 127 A1 4/1991 European Pat. Off. .

*Primary Examiner*—Donald E. Czaja
*Assistant Examiner*—Michael P. Colaianni
*Attorney, Agent, or Firm*—Hill, Steadman & Simpson

[57] ABSTRACT

The flat workpieces (W) are conveyed in the vertical position on a horizontal transport path through at least one processing cell (BZ) that contains a processing bath, vertical slots (S) for the passage of the workpieces (W) being provided in the end walls of the processing cell (BZ). Bars or rods which are arranged in pairs in the processing bath, such that they are loose in the vertical direction, are assigned in pairs to the slots (S) as seals (D) and are pressed by the liquid pressure against one another or against the workpiece (W) respectively passing through, and against the assigned end wall of the processing cell (BZ). Seals (D) having a circular cylindrical cross section rotate while the workpieces (W) are passing through. The seals (D) are preferably arranged in end chambers (SK) which are fitted at the ends to the processing cells.

7 Claims, 2 Drawing Sheets

DEVICE FOR PROCESSING FLAT WORKPIECES, IN PARTICULAR PRINTED CIRCUIT BOARDS

BACKGROUND OF THE INVENTION

The present invention generally relates to an apparatus for the immersion processing of moving workpieces through a bath. More particularly, the present invention relates to a seal arrangement at the ends of an immersion processing chamber through which a relatively flat workpiece, such as a printed circuit board, can enter and exit the immersion chamber with a minimal leakage of the bath fluid.

EP-A-0 421 127 discloses a device for processing printed circuit boards, in the case of which the individual printed circuit boards are conveyed continuously in a vertically hanging position on a horizontal transport path through successively arranged processing baths. The transport of the printed circuit boards through the processing baths which are accommodated in processing cells, is facilitated by brackets arranged on endlessly revolving drives. Those brackets, in the case of electrochemical processing, at the same time also make the cathodic contact with the printed circuit boards. Vertical slots for the passage of the printed circuit boards are located in the end walls of the processing cells, seals which are designed as a brush seals or strip brush seals being provided in the passage region. The individual processing cells are arranged in catchment troughs, from which the bath liquid which is caught is continuously fed back into the assigned processing cells with the aid of appropriate pumps. A continuous feedback of the bath liquid also makes it possible to maintain a constant level in the individual processing cells here.

U.S. Pat. No. 4,401,522 discloses a device for the electrolytic processing of printed circuit boards, in which vertically arranged roller pairs act as seals to the vertical slots in the end walls of the processing cells. The rollers, which are composed of an elastic material, are provided as roller pairs which are pressed against one another in a sprung manner and are driven at a speed matched to the transport speed of the printed circuit boards passing through. An object of the invention in the case of a device for the processing of flat workpieces, is to improved an improved device which enables effective sealing of the vertical slots in the end walls of the processing cells for the passage of the workpieces, using simple means, and of minimizing the escape of bath liquid in the region of the slots.

SUMMARY OF THE INVENTION

The present invention achieves the aforementioned object by providing an improved device for immersion processing of flat workpieces, such as printed circuit boards. The device is for use with a manufacturing arrangement in which the workpieces are held in a vertical position and conveyed along a horizontal transport path. To this end, the device includes an immersion processing cell for containing a processing bath fluid. The processing cell is formed by a trough. The processing cell has a pair of opposed vertical end walls, and each of these end walls has a vertical slot disposed therein to accommodate a respective entry and exit through which the workpieces may be conveyed, immersing the workpieces in the bath as they are conveyed through the processing cell. Each of the slots has a pair of seals which permit the workpiece to pass into or out of the slot between the respective pair of seals, while minimizing loss of the bath fluid through the slot. Each of the seals is cylindrical in shape, and at least one cylindrical element. The seals are free and movable relative to the processing cell and disposed generally vertically, but the seals are retained. Fluid pressure from the bath acts against the seals so that the seals are pressed toward one another and against the respective end wall.

In an embodiment, an end chamber is formed in the each of the end walls to retain the respective pair of seals in a generally vertical position proximal to said slot, but in a freely moveable manner relative to the end wall. Each end chamber is wider than the respective slot, which bisects the chamber.

The advantages which are achieved by the invention are, in particular, that the sealing of the slots is carried out virtually automatically by the pressure of the bath liquid. As a result of the loose arrangement of the bars or tubes in the processing bath, they are pressed, by the pressure which is exerted on them by the bath liquid, on the one hand against one another or against a workpiece which is passing through, and, on the other hand, from the inside against the end wall of the processing cells, that is to say the liquid pressure produces a seal precisely at those points at which the bath liquid could escape. A rotating bearing for the bars or tubes and, in particular, a drive such as that in the case of the known roller pairs which are used as seals, can be omitted.

In an embodiment, the invention makes it possible for the bars or tubes to rotate automatically when the workpiece is passed through and thus also to process workpieces which are extremely sensitive to friction.

In an embodiment, the seals are disposed in end chambers disposed at opposing ends of the immersion processing cell. This provides an advantage of enabling a certain amount of conveyance and holding of the seals without adversely affecting the loose arrangement, which is required for the sealing effect, in the bath liquid. In an embodiment wherein the seals are made of plastic tubing, it is possible to use commercially available bars or tubes which are not attacked or corroded by most processing baths.

In an embodiment, the seals are provided as vertical segments, making it possible to match the seals automatically to various heights of the workpieces passing through. In the case of workpieces having a relatively small height, the lower segments are pressed against one another by the liquid pressure, while the upper segments are pressed against the workpiece which is passing through.

Additional features and advantages of the present invention are described in, and will be apparent from, the detailed description of the preferred embodiments and from the drawings.

DETAILED DESCRIPTION OF THE PREFERRED EMBODIMENTS

Figure 1:
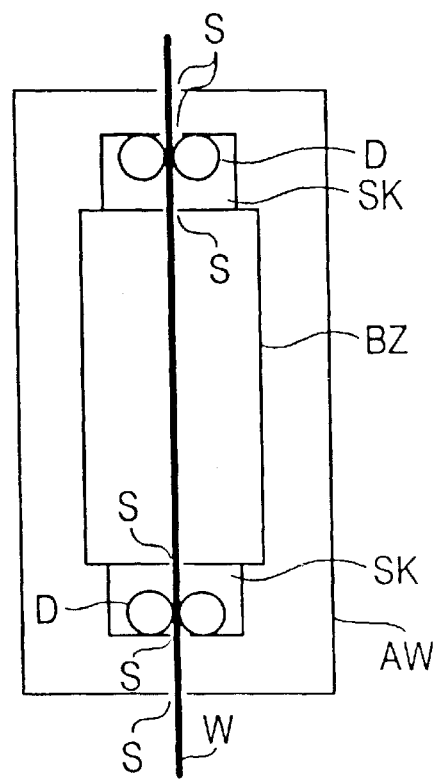
FIG. 1 is a schematic a plan view of a processing cell which is provided with end chambers on the inlet side and outlet side.
Figure 2:
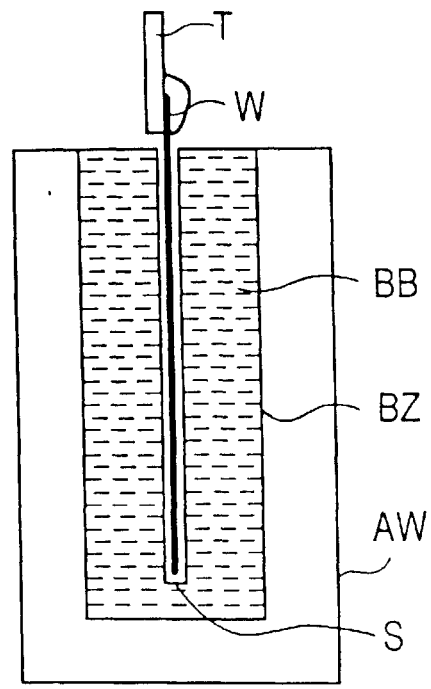
FIG. 2 is a cross-sectional end view of the processing cell which is illustrated in FIG. 1.

FIGS. 1 and 2 show a plan view and cross section, respectively, of an immersion processing cell BZ which is formed in a through AW, containing an immersion processing bath BB, and through which vertically hanging flat workpieces W are conveyed on a transport means shown here in the form of brackets T. End chambers SK are located at the two ends of the immersion processing cell BZ, in which end chamber SK seals D which are formed by circular cylindrical plastic tubes are arranged in pairs and loosely in vertical alignment. The end walls of the immersion processing cell BZ of the end chambers SK and of the trough AW are provided with vertical slots S dimensioned so that the flat workpieces W can be conveyed without hindrance. The slot from the processing cell BZ to the end chamber SK permits fluid flow from the bath BB to enter the end chamber SK.

Figure 3:
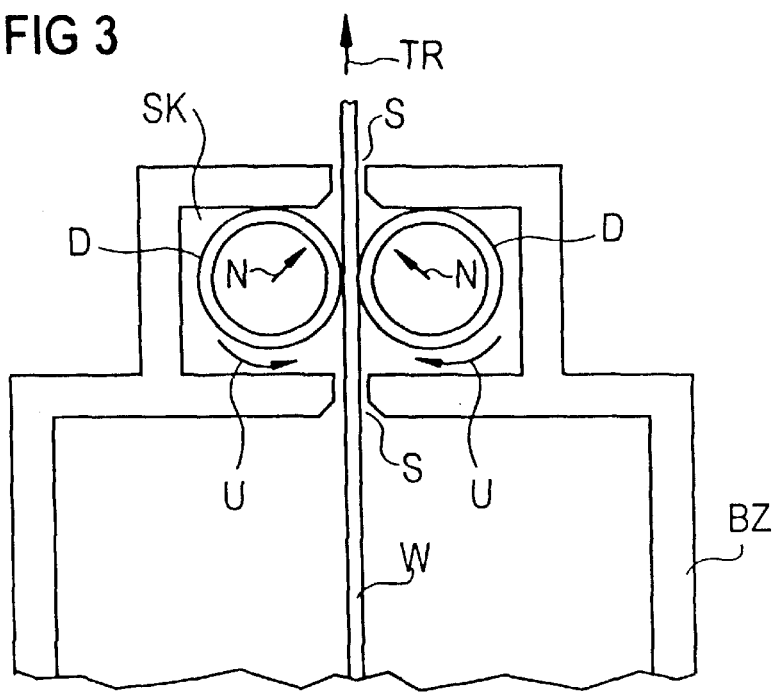
FIG. 3 is an enlarged fragmentary plan view of the end chamber of the processing cell of in FIG. 1, in greater detail.

FIG. 3 is also referred to for the further explanation of the method of operation of the end chamber SK and the seals D. The liquid pressure of the processing bath BB which is present in the end chamber SK acts on about three quarters of the circumference of the seals D, while the normal atmospheric pressure acts from the outside on the remaining quarter. The resultant forces acting on the seals D are indicated by arrows N in FIG. 3. It can be seen that these forces N press the seals D on the one hand against the workpiece W passing through and on the other hand against the end wall of the end chamber SK, and thus produce an effective seal which at least mostly prevents the bath liquid from escaping. If no workpiece W is currently located between the two seals D, then the paired seals are pressed against one another by the forces N and thus likewise prevent the bath liquid from escaping.

When the workpieces W are being transported through the end chambers SK in the transport direction TR, the two seals also rotate automatically, the revolution directions being indicated by arrows U in FIG. 3. The friction between the seals D and the workpiece W is in this case so small that there is no need to worry about any damaging adverse effect on the workpieces even in the case of extremely sensitive workpieces W. Sensitive coatings which may be applied to the workpiece W in the processing cell BZ are likewise not adversely affected.

Figure 4:
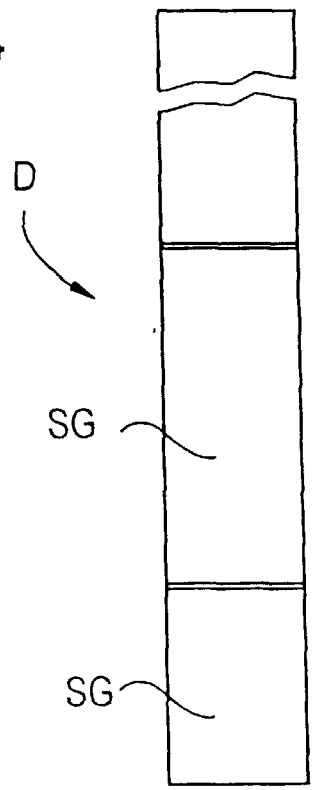
FIG. 4 is a fragmentary side view of a segmented seal according to an embodiment of the invention, wherein the seal includes a plurality of vertically stacked segments.

FIG. 4 shows that the seals D are divided into segments SG in the vertical direction. This makes it possible for a seal to match itself automatically to different heights of the workpieces W passing through. When workpieces W having a relatively small height are passed through, the upper segments SG are pressed against the workpiece W which is passing through, and the lower segments SG are pressed against one another.

The sealing, which has been described above, of the processing cells is particularly suitable for the processing of printed circuit boards in electrochemical baths and other processing baths.

The principle of sealing by means of bars or tubes which are arranged loosely in the processing bath can also be used in the case of flat workpieces which have projections, ribs or other protrusions, if their height is relatively small. Circumferential grooves can be provided in the seals D, the grooves having a corresponding diameter and shape to receive and roll over such protrusions.

Various changes and modifications to the presently preferred embodiments will be apparent to those skilled in the art. Such changes and modifications may be made without departing from the spirit and scope of the present invention and without diminishing its attendant advantages. Therefore, the appended claims are intended to cover such changes and modifications.

What is claimed is:

1. A device for immersion processing of flat workpieces which are conveyed in the vertical position on a horizontal transport path, the device comprising:

an immersion processing cell for containing a processing bath fluid, the processing cell having a pair of opposed vertical end walls, each of the end walls having a vertical slot disposed therein to accommodate a passage of the workpieces; and a plurality of seals, a pair of the seals being assigned to the each of the vertical slots, each of the seals being cylindrical in shape, the seals being free and movable relative to the processing cell and disposed generally vertically, such that the seals are pressed by pressure of the bath (a) against one another and against the respective end wall when a workpiece is not disposed therebetween, and (b) against opposing outer surfaces of a workpiece and against the respective end wall when a workpiece is disposed therebetween, preventing a significant flow of said bath fluid from the respective slot and permitting a passage of the workpieces through the respective slot and between each of the pairs of seals.

2. The device as claimed in claim 1, wherein the seals are arranged in end chambers located at opposite ends of the processing cell.

3. The device as claimed in claim 1, wherein the seals are made of plastic.

4. The device as claimed in claim 1, wherein each of the seals includes a plurality of vertically stacked cylindrical segments.

5. An immersion processing device comprising:

a trough defining an immersion cell adapted to contain a liquid immersion bath, the trough having a pair of opposite end walls;

a pair of vertical end chambers, one end chamber being defined in each of the end walls;

a pair of vertical slots, each of the vertical slots being disposed through one of the end walls and bisecting a respective one of the end chambers, each of the vertical slots having a shape to accommodate a passage of the workpieces;

a plurality of seals, each of the seals including at least one cylindrical member, a pair of the seals residing generally vertically in each of the end chambers proximally to the respective slot, each of the seals being cylindrical in shape, the seals being positioned and freely movable within the end chamber to allow the passage of one of said workpieces between a respective pair of the seals and so that fluid pressure of fluid from the bath presses the seals (a) against one another and against the respective end wall when a workpiece is not disposed therebetween, and (b) against opposing outer surfaces of a workpiece and against the respective end wall when a workpiece is disposed therebetween, minimizing leakage of said bath from the respective slots.

6. A device as defined in claim 5, wherein each of the seals is a plastic tube.

7. A device as defined in claim 5, wherein each of the seals includes a plurality of independently moveable, vertically stacked segments.

* * * * *